United States Patent [19]
Sano et al.

[11] Patent Number: 5,136,388
[45] Date of Patent: Aug. 4, 1992

[54] METHOD OF EVALUATING A SOLID STATE IMAGE SENSOR USING FREQUENCY DISTRIBUTION PROFILE

[75] Inventors: Yoshikazu Sano, Osaka; Takumi Yamaguchi, Kyoto; Tomoya Tanaka, Yao, all of Japan

[73] Assignee: Matsushita Electric Industrial Co., Ltd., Osaka, Japan

[21] Appl. No.: 411,093

[22] Filed: Sep. 22, 1989

[30] Foreign Application Priority Data

Sep. 22, 1988 [JP] Japan .................. 63-237663

[51] Int. Cl.[5] .................. H04N 3/14; H04N 5/30
[52] U.S. Cl. .................. 358/213.18; 358/139; 358/163
[58] Field of Search .......... 358/213.18, 139, 213.13, 358/163, 167; 382/18, 51

[56] References Cited

U.S. PATENT DOCUMENTS

| | | | |
|---|---|---|---|
| 4,392,157 | 7/1983 | Garcia et al. | 358/213.18 |
| 4,639,775 | 1/1987 | Cohen et al. | 358/213.18 |
| 4,761,685 | 8/1988 | Asaida et al. | 358/139 |

OTHER PUBLICATIONS

"Testing CCD Image Sensors with ATE", Solid State Technology, Nov. 1986, No. 11, Port Washington, N.Y., Mark E. Jagiela.
"Film Quality From Electronics–Who Controls It?", Image Technology, Oct., 1987, No. 10, London, Gr. Britain, Nick Viliesid, MBKSTS, MRTS.
"Testing For A Solid-State Color Image Sensor", 1986 International Test Conf., 683–686, New York, T. Noguchi et al.

Primary Examiner—James J. Groody
Assistant Examiner—Kim Yen Vu
Attorney, Agent, or Firm—Wenderoth, Lind & Ponack

[57] ABSTRACT

A method of evaluating the characteristics of a solid state image sensor measures the unit cell output values of the sensor and assigns the output values to a predetermined rank, and counts the number of unit cells cumulatively in each rank, and then, by regarding the frequency distribution profile of the unit cell output values obtained in such way as the intrinsic electrical characteristics of the sensor, judges the picture quality of the sensor by using this frequency distribution profile.

6 Claims, 4 Drawing Sheets

MONITOR SCREEN

COMPARISON OF FREQUENCY DISTRIBUTION PROFILES

METHOD OF EVALUATING A SOLID STATE IMAGE SENSOR USING FREQUENCY DISTRIBUTION PROFILE

BACKGROUND OF THE INVENTION

This invention relates to a method of evaluating a solid state image sensor by inspecting and judging electrical characteristics of a solid state image sensor.

Recently, solid state image sensors have been widely used in consumer-use and industrial fields. At the same time, there is a lot of demands for higher picture quality such as high resolution, wide dynamic range, low smear, and low dark current a high temperature.

Among solid state image sensors, especially in area sensors, the picture quality requirement is particularly severe, and it is important to inspect correctly and select products satisfying the picture quality specification determined between manufacturers and users.

Conventionally, the electrical charactersitics of a solid state image sensor were evaluated and sorted generally by testing the semiconductor wafer after the diffusion process by means of a tester. In this case, items of judgement are DC defects, extreme black or white flaws on the screen, and obvious contrast unevenness.

However, final judgement and ranking of the picture quality for satisfying the user's requirements are visually executed by a man. That is, a man checks a screen projected on the monitor television and inspects whether or not there are abnormal phenomena on the screen. The human visual sorting is a kind of a sensory inspection, that is, comparing the actual image with the standard image stored in an inspector's brain, and when the differences between them are within the allowable limit of the inspector, the product is regarded as conforming. In general, this sorting and comparing ability is excellent, and it is particularly effective for discovering tiny abnormal spots on an entire homogenous screen.

On the other hand, when evaluating solid state image sensors based on the electrical characteristics, the abnormality in DC operation or very clear black or white flaws on a screen are converted into values of voltage or current and such voltage or current values are measured. After that, when an item outside a standard specification is found, the product is handled as defective. However, in the case of white or black roughness of a delicate screen, a tiny black spot or white spot, or the background state of the screen at a high temperature in a dark screen, it is very dangerous to make a judgement based only a on voltage, current or other measurement. That is, when a screen which has slight defects is judged as defective, many products that may be approved by the visual impression of the screen may be judge as defectives. To the contrary, if only apparent defective products are rejected, there is a possiblility that multiple defective products may be mixed in with the conforming products.

Accordingly, there is no better way, at the present, than the method of actually operating a solid state image sensor, projecting the image on the monitor television screen, and judging the image visually by a man as mentioned above.

The human visual judgement, in spite of the excellent advantages as seen above, involves, among others, the following demerits.

(1) The criterion depends greatly on the individual ability of inspectors.

(2) The criterion is likely to be influenced by the individual mental state of an inspector, and it is difficult to always guarantee the same sorting level.

(3) A taining period is needed, and only limited inspectors may be engaged in the work in order to keep the inspection and selection level constant.

(4) Even a skilled inspector may sometimes make a mistake in judgement.

(5) It is difficult to increase the inspection speed.

In a representative solid state image sensor, hundreds of thousands of unit cells care neatly arranged, and each unit cell generates electrical charges depending on the quantity of light, and the generated electrical charges are sequentially transferred depending on the potential changes of the voltage. In this case, the reason why it is not possible to correctly select merely by the amplitude of the output value of each unit cell is that, for example, even if plenty of electrical charges are generated from a certain unit cell, when the surrounding unit cells also generate plenty of electrical charges, the impression of the screen is not necessarily bad for the human eye, or that, to the contrary, a unit cell suppresed at a very low electrical charge generation in a dark state may appear to be a white spot to the human eye on the screen having a lower background, so as to be judged as a defective screen.

Thus, the difficulty of inspection of solid state image sensors lies in that the relative impression of the entire screen to the human eye, black and white spots, roughness of the screen, and balance of whether disturbing to the human eye or not cannot be expressed by a mere electrical measurement.

Mostly, at the present, through the visual inspection, the impression of the screen is classified into ranks (for example, rank A, B, C and D), and the products are accordingly sorted and shipped.

Besides, when the technical analysis and investigation are needed, the data lacks objectiveness for discussion by the rank classification based on the impression of the inspectors, and the individual impressions themselves are also different.

Anyway, the demerits (1) to (5) of human visual inspection always occur as long as this method is employed.

SUMMARY OF THE INVENTION

It is hence a primary object of the present invention to evaluate the characteristics of a solid state image sensor by measuring the output value of unit cells of the sensor, then distributing the output values according to the predetermined rank, and then, counting cumulatively in each rank, and then, regarding the characteristics and shape of the frequency distribution of the unit cell outputs plotted in such way as the inherent electrical characteristics of the sensor, and evaluating the quality of the sensor device according to the frequency distribution.

It is a secondary object of the present invention to judge the quality of the characteristics by comparing the obtained profile and characteristics of the frequency distribution of unit cell outputs of the solid state image sensor, with the unit cell output frequency distribution of a predetermined standard sensor.

That is, instead of the conventional visual inspection of the monitor television screen by a man, the unit cell outputs in a dark state and a high temperature state are expressed as a frequency distribution, and are compared with the predetermined distribution profile, thereby inspecting and judging the dark current characteristics at a high temperature.

Moreover, the unit cell outputs of a solid state image sensor actually operated in the predetermined conditions of illumination, temperature, applied voltage, etc. are expressed as a frequency distribution, which is compared with the frequency distribution shape and characteristics of a standard device conforming to the same conditions, and the state of white flaws and black flaws of the screen is judged.

By expressing the unit cell outputs of a solid state image sensor as a frequency distribution, and regarding the distribution shape and characteristics as the electrical characteristics intrinsic to the sensor, the sensory classification of picture quality conventionally judged by the human visual inspection can be expressed as a digital distribution profile. Based on the pattern of the distribution profile, the impression of the entire screen can be numerically expressed. Also, based on the spread of the profile, fluctuations of unit cell outputs of the entire screen can be determined. Furthermore, based on reading the output values directly from the distribution profile, the absolute valves of the characteristics of the device can be obtained.

In the evaluation of a solid state image sensor, by expressing the unit cell outputs as the profile of frequency distribution, the differences between individual persons are eliminated, and objective data of sensor characteristics may be obtained, which may serve as the judging material for technical analysis.

Besides, by overlapping multiple frequency distributions of the unit cell outputs of conforming image sensors in predetermined conditions and extracting the common distribution profile and characteristics, a specified standard profile may be obtained. By preliminarily storing such a standard frequency distribution profile in an inspection apparatus, the difference from the distribution profile of the image sensor being measured or its characteristics may be obtained. By numerically expressing the limit of such a difference, if the difference is within a normal range, it may be judged as a conforming device, and if exceeding the limit, it may be handled as a defective one.

Furthermore, when the distribution profile is displayed on the monitor television or printed out on the paper, the electrical features of the image sensor may be objectively known by observing such profile.

Hitherto, to preserve or report the impression of the screen, the classification rank, sketch of the screen, or photographs were recorded. To the contrary, in the method of this invention, the features of the entire screen can be indicated by the digitally expressed frequency distribution profile and numerical values for expressing the characteristics.

Other objects of the invention will be better understood from the following detailed description of the preferred embodiments taken in conjunction with the drawings.

DETAILED DESCRIPTION OF THE INVENTION

Figure 1:
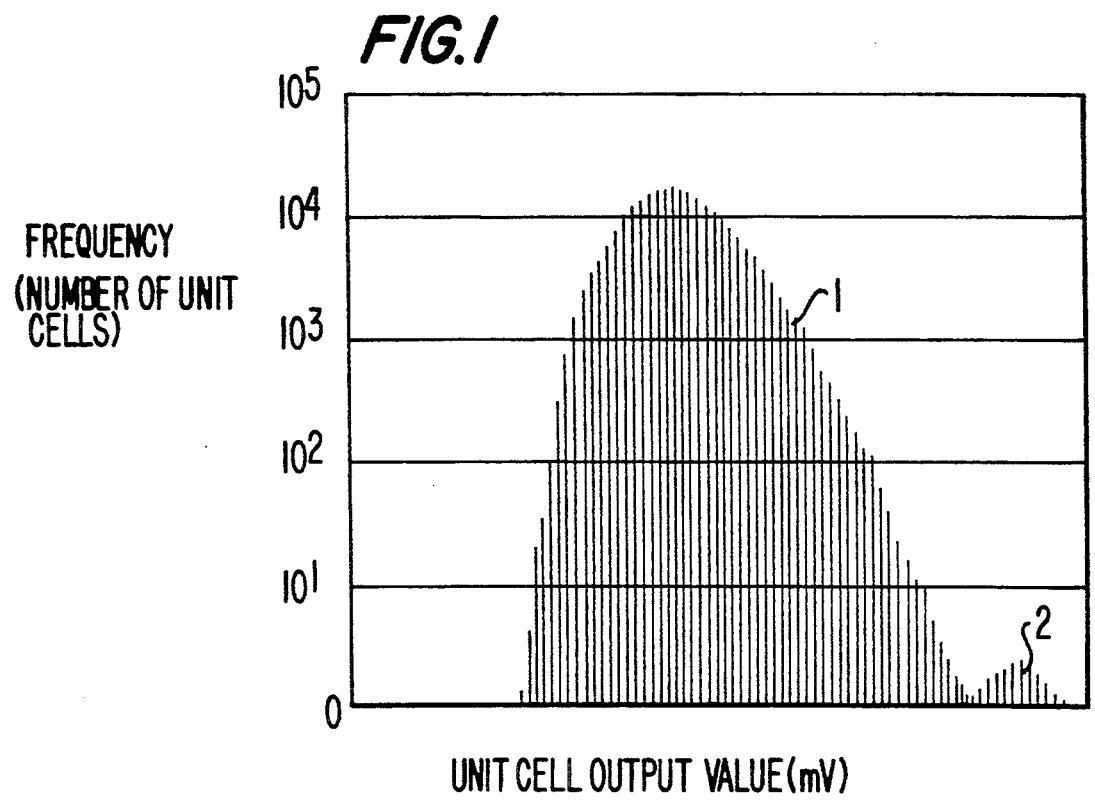
FIG. 1 is a frequency distribution profile diagram of unit cell outputs in one of the embodiments of a method of evaluating a solid state image sensor of the present invention.

Referring now to the drawings, this invention is described in detail below in reference to an embodiment thereof.

FIG. 1 is a frequency distribution profile showing an embodiment of the present invention.

In FIG. 1, fluctuations of dark current are measured in the state of high temperature and dark condition (not emitting light at all) by measuring the output values of all unit cells of a solid state image sensor, and the frequencies are counted according to the width of a predetermined output value class, and the result of such counting is drawn as a frequency distribution profile. The ordinate axis denotes the frequency corresponding to the number of occurrences of the unit cell output value within each output value class. Logarithmically expressing in order to show all unit cells graphically, the intersecting point with the abscissas axis is set at 0 for the sake of convenience, and graduations of $10^1$, $10^2$, $10^3$, $10^4$, $10^5$ are calibrated. On the abscissas axis, the unit cell output values are assigned to the corresponding class, and the number of pieces within each class is counted. As a result, a frequency distribution profile 1 is formed. The distribution profile in the dark condition is approximated, for example, by Poisson's distribution. At the right edge of the distribution profile 1, there is an abnormal distribution profile 2 not conforming to the smooth curve. It indicates an abnormal point on the screen.

Figure 2:
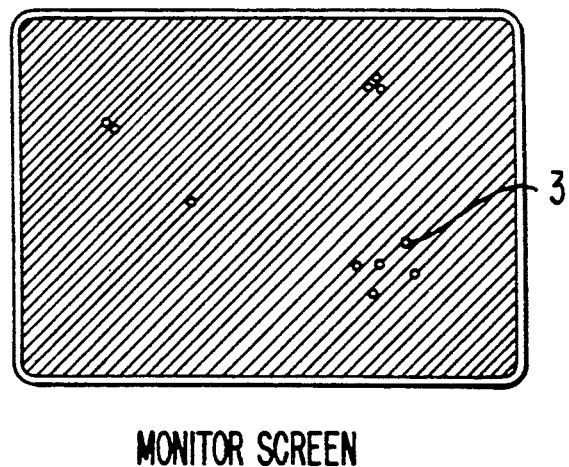
FIG. 2 is a drawing showing an example of monitor television display of the solid state image sensor used in the frequency distribution of FIG. 1.

FIG. 2 shows an example of projection of a solid state image sensor having the frequency distribution in FIG. 1 on a monitor television screen at a high temperature and dark condition.

The entire screen is uniformly black, but there are 11 abnormal spots 3 shown as white spots. It means that specific portions of unit cells are abnormally larger than the mean dark current output of entire unit cells, and that the excess electrical charges are transferred by leakage currents so as to be displayed as white spots on the screen.

The feature of the screen of this image sensor is exactly expressed in the frequency distribution profile in FIG. 1. The entire screen is formed as a large and smooth frequency distribution profile 1, and there is a tiny abnormal distribution profile 2 at a position largely disposed to the right from the central part of the frequency distribution profile 1. The more the abnormal distribution profile 2 shifts to the right from the central part of the frequency distribution profile 1, the larger the abnormal unit cell output value becomes, and the abnormal unit cell appears more clearly and white on the screen. In this example, since the height of the peak of the abnormal distribution profile 2 is low and the area is small, it is judged that there are about 10 abnormal unit cells in total.

Figure 3:
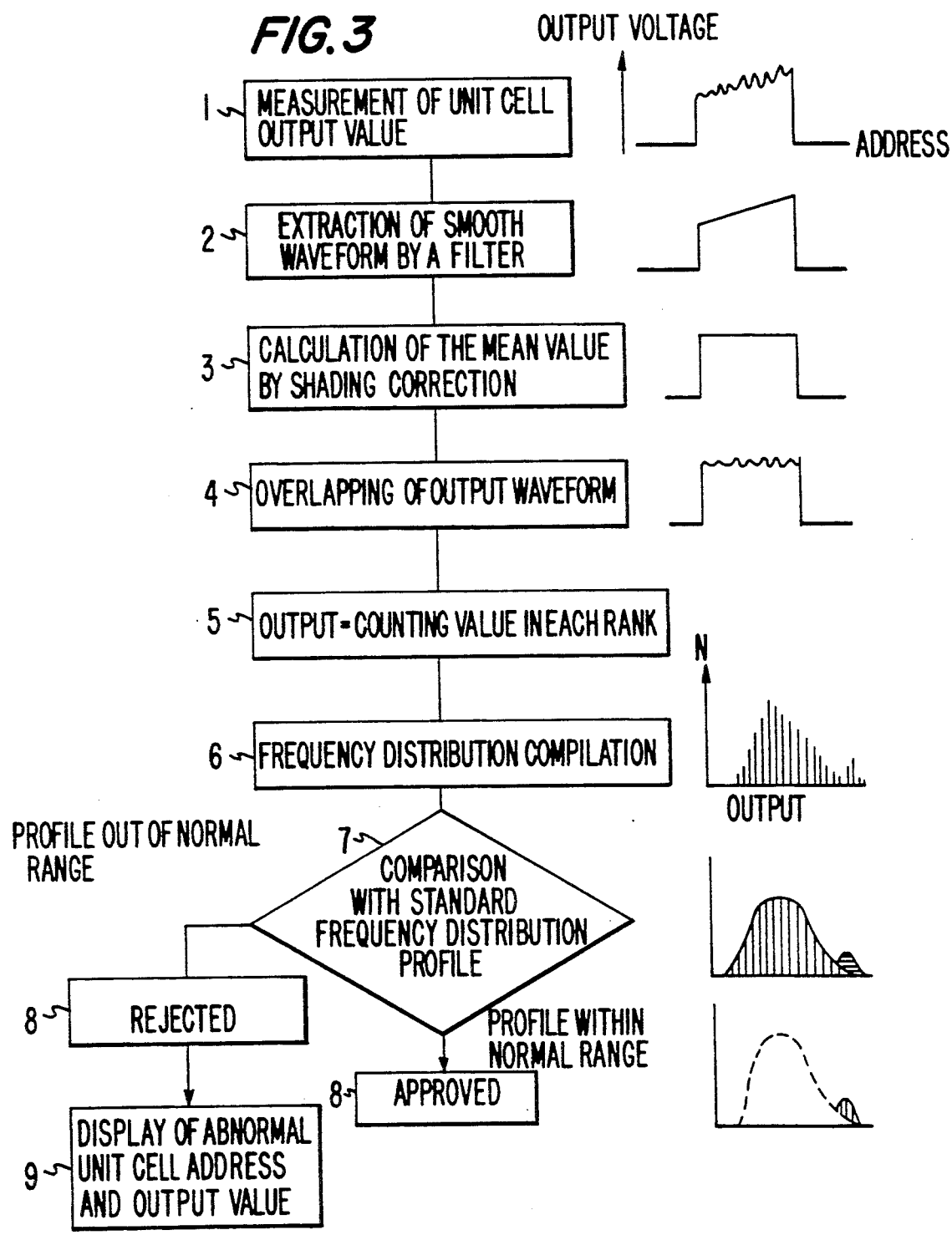
FIG. 3 is a drawing showing a procedure of the evaluation method making use of the frequency distribution of unit cell outputs.

FIG. 3 shows the evalution procedure by making use of the frequency distribution profile, which is explained sequentially from step 1 to step 9 below.

1. The address of each unit cell and the corresponding unit cell output value are measured.
2. Using a filter, the output waveform is shaped into a smooth waveform, and the difference from the original waveform is extracted, and the signal quantity of fluctuations is obtained.
3. Correcting the shading which is an output slope of the entire picture, the mean output value suited to the screen impression obtained from human eyes is obtained.
4. The mean waveform corrected of shading is overlapped with the fluctuation signal extracted at step 2, and the signal to be used in frequency distribution is obtained.
5. According to the predetermined output class all unit cell output values are assigned to corresponding classes, and the frequency of outputs assigned to each class is counted.
6. Plotting the frequency N on the ordinate axis and the class of unit cell output value on the abscissas axis, the frequency distribution profile depending on the scale is drawn.
7. Comparing the measured distribution profile under the predetermined conditions with the standard distribution profile under the same conditions, the differences between them are determined.
8. A device is approved as a conforming device when the differences of characteristics settle within a normal range. To the contrary, a device is rejected as a defective device if the characteristic differences are out of the normal range.
9. If it is desired to display the portion out of the normal range, the address and output value of the abnormal unit cell can be displayed.

Figure 4:
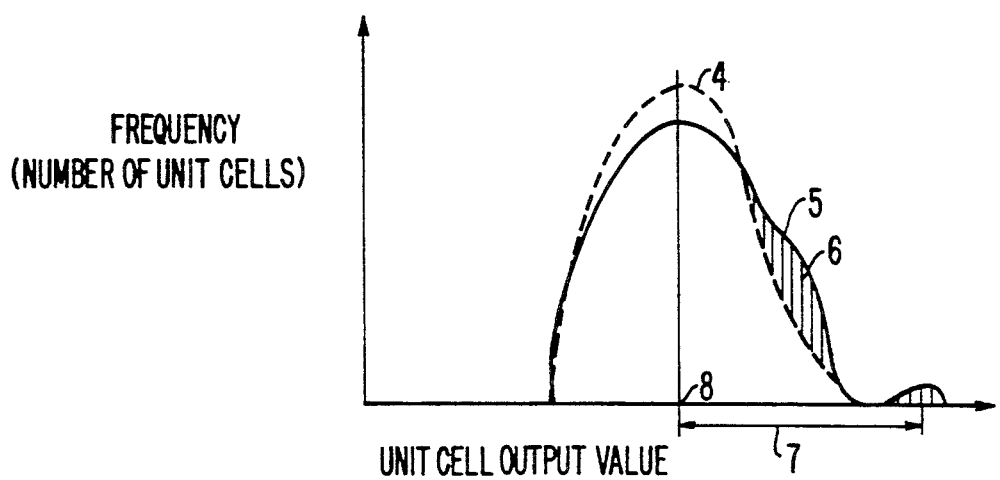
FIG. 4 is a drawing for explaining the evaluation method by comparison between the standard pattern profile and the measured frequency distribution profile.

FIG. 4 shows the method of inspection by comparison between the standard profile 4 and measured frequency distribution profile 5.

The standard profile 4 is determined from the common profile and its fluctuation range by overlapping multiple unit cell output frequency distribution profiles of conforming devices.

During inspection, the mean value of the standard profile 4 and the mean value of the measured profile 5 are matched at point 8. By overlapping these two profiles, the number of unit cells which exceeds the standard profile 4 and the difference of the unit cell output values which exceeds the standard profile 4 are extracted. In FIG. 4, the area 6 indicates the extracted number and output values. Moreover, the feature of the screen is judged by finding the extreme point where the curve slope is zero, calculating the difference 7 of the mean value 8 and the extreme point, and counting the number of unit cells judged by the intensity of the white spots or black spots, the height of the extreme point, and the area of the abnormal profile.

Figure 5:
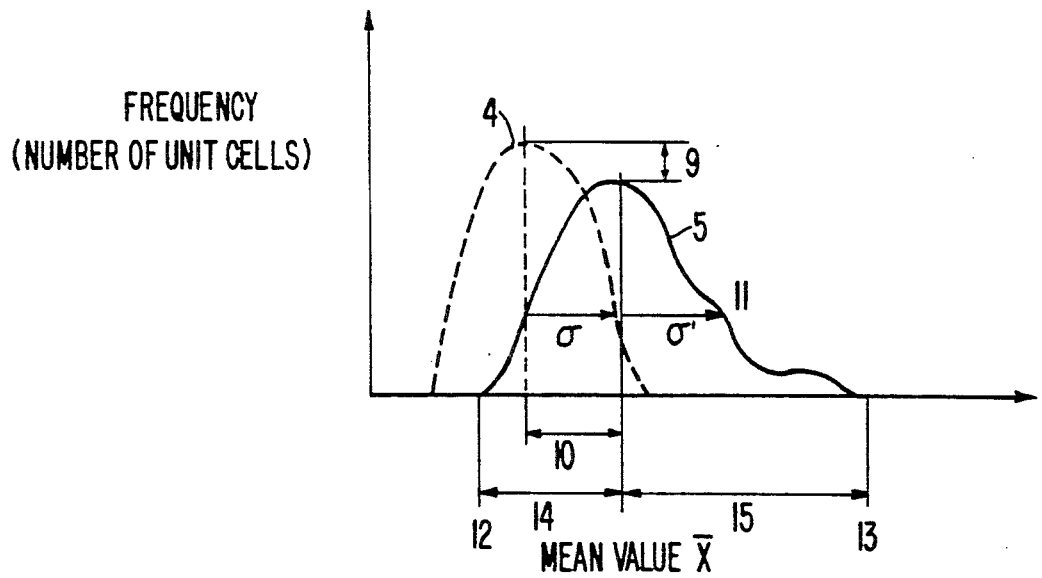
FIG. 5 is a drawing showing the comparison between the measured frequency distribution profile and the standard frequency distribution profile.

FIG. 5 shows the element by element comparison between the measured profile 5 and the standard profile 4. The elements of the measured profile 5 are compared with that of the standard profile 4, and the differences are judged to be within the predetermined range or not in order to determine approval or rejection. The differences in the elements include, among others, the difference of the maximum frequency 9, difference of the mean value 10, comparison of standard deviation value ($\delta$) 11, comparison of the minimum value 12, comparison of the maximum value 13, difference 14 between the mean value $\bar{x}$ and the minimum value 12, and difference 15 between the mean value $\bar{x}$ and the maximum value 13. By comparing these elements of the measured profile 5 with those of the standard profile 4, the electrical characteristic of a solid state image sensor to be evaluated may be judged.

FIGS. 6(a)–6(h) show typical picture quality examples and their corresponding frequency distribution profiles.

Figure 6A:
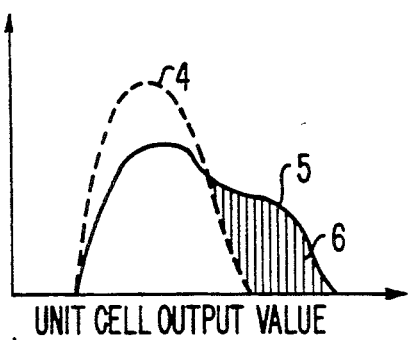
FIGS. 6(a) to 6(h) are drawings showing typical picture quality examples and their corresponding frequency distribution profiles.
Figure 6E:
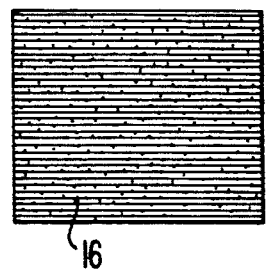
Figure 6B:
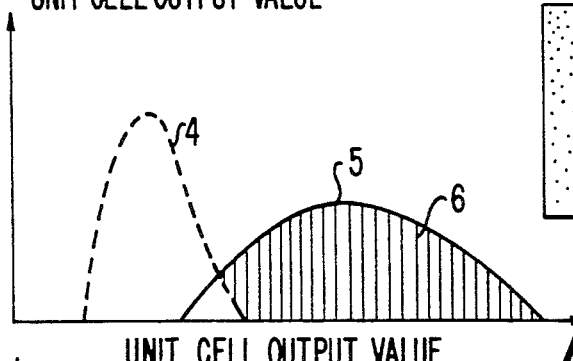
Figure 6F:
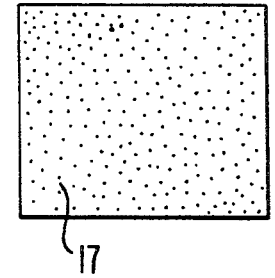
Figure 6C:
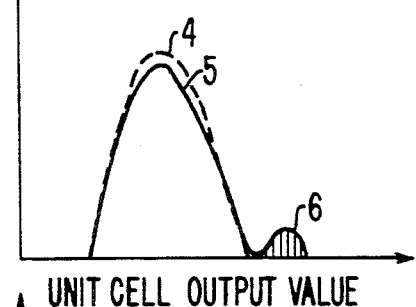
Figure 6G:
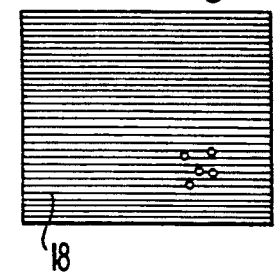

FIGS. 6(a) to 6(c) show the screen impression and frequency distribution profile in a high temperature and dark condition, which are used for judgement of inspection by comparing the measured profile 5 with the standard profile 4.

FIGS. 6(a) and 6(e), the background of screen 16 is black, and multiple white spots are floating in the background. In the measured profile 5 of the device to be evaluated, the peak value is at the position on the abscissas axis nearly the same as the peak of the standard profile 4, but the bulging as the cause of white spots appears as a different profile 6 from the standard profile 4 at the right side of the central part. In the case of this example, since the differing area is wide (in other words, there are in plenty of different pieces); it is known that multiple white spots spread widley.

In FIGS. 6(b) and 6(f), the background of screen 17 is white on the whole, and a white roughness of the entire surface is intense (fine white spots are present, giving an impresison of a rough screen).

The measured profile 5 of this device has the mean value which is disposed largely to the right side of the axis of abscissas with respect to the mean value of the standard profile 4, which shows that the leakage current is large on the whole. Beside, the spread of the minimum and the maximum values are more than twice as wide as those of the standard profile, and the homogeneity of the screen is poor, and it tells that the entire surface is white and rough.

In FIGS. (6c) and 6(g), the background of screen 18 is uniformly black, and several clear white spots are present.

In the unit cell output distribution of this device, both the profile 5 and means value are nearly matched with the standard profile 4, but in the portion remote from the mean value to the right side (higher output side), there is a small abnormal distribution 6. It means that there are several unit cells having a larger leakage current than the leakage current of the surrounding unit cells. This causes white spots.

Figure 6D:
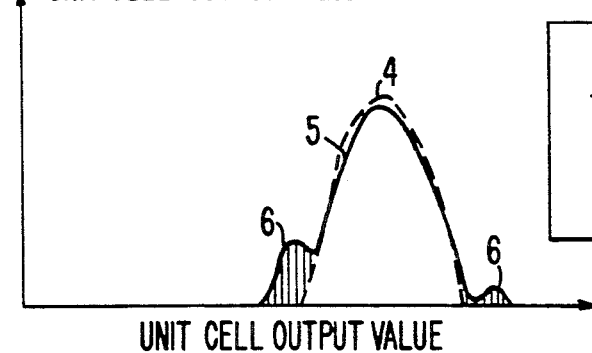
Figure 6H:
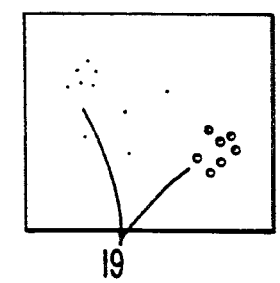

FIGS. 6(d) and 6(h) show the unit cell output distribution profile of a solid state image sensor and its screen image. The screen has a background in the brightness corresponding to the predetermined quantity of light, but several black spots and white spots 19 are present.

The unit cell output distribution profile 5 of this device nearly coincides with the standard profile 4, but at the right and left sides of the mean value (both low and high output sides of the mean value), there are small abnormal distributions 6 different from the standard profile 4. It means that there are a few unit cells generating considerably lower charges and higher charges than the surrounding unit cells. The greater the difference between the mean value on the abscissas axis and the right and left abnormal distributions 6, the more the distinction of black spots and white spots stand out against the background of the screen, so that the presence of black and white spots becomes obvious. It also tells that more black spots and white spots are present when the height and area of the abnormal distribution 6 increase.

As is clear from the explanation herein, this invention presents an evaluating method for a solid state image sensor by expressing the unit cell outputs in frequency distribution, and judging the electrical characteristics of the solid state image sensor by using this distribution profile and its characteristics. Accordingly, in the region conventionally not judged by a tester or other inspection apparatus, but being obliged to evaluate by sensory inspection by a man based on the visual observing and sorting the screen projected on the monitor television, it is possible to evaluate quantitatively at a high speed and at a high repeatability.

Besides, using the frequency distribution profile of unit cell outputs of conforming devices as the standard pattern, by defining the fluctuation range and comparing with the frequency distribution profile of the unit cell outputs of measured device, it is possible to judge and sort the solid state image sensors according to their electric characteristics. Furthermore, by using the features of the frequency distribution profile of the unit cell outputs of the measured device, the impression of the entire screen can be quantitatively expressed, so that the devices to be inspected can be easily classified according to the items of defects.

Moreover, by setting the scope of the amount of difference from the standard profile, the specification of the standard may be easily widened or narrowed, and if the requested specification varies with each user, it is possible to execute a necessary and adequate evaluation according to the specification of each user. What is more, the "subjective criterion based on the screen impression that cannot be expressed quantitatively," which is a defect of visual sensory inspection, can be digitized and expressed quantitatively in a graphic pattern, so that it is possible to ship devices by always inspecting with the same criterion.

Thus, according to the evaluating method for a solid state image sensor of this invention, the device characteristics may be evaluated and judged promptly and accurately

We claim:

1. A method of evaluating a solid state image sensor comprising:
    a step of expressing output values of the unit cells of said solid state image sensor in a frequency distribution and
    a step of judging the picture quality of said solid state image sensor based on said frequency distribution;
    wherein said frequency distribution is expressed as a profile in which the output value of each unit cell is assigned to a predetermined output value class according to each output value of said unit cell on a first axis, and the number of unit cells assigned to each predetermined output value class is plotted on a second axis.

2. A method of evaluating a solid state image sensor comprising:
    a step of expressing output values of the unit cells of a standard solid state image sensor in a standard frequency distribution;
    a step of expressing output values of the unit cells of a solid state image sensor to be evaluated in a measured frequency distribution, and
    a step of comparing said measured frequency distribution with said standard frequency distribution in order to judge and sort said solid state image sensor to be evaluated as a conforming device or a defective device.

3. A method of evaluating a solid state image sensor according to claim 2;
    wherein said standard and measured frequency distributions are respectively expressed as profiles in which said output value of each unit cell is assigned to a predetermined output class according to each output value of said unit cell on a first axis, and the number of unit cells assigned to each predetermined output value class is plotted on a second axis.

4. A method of evaluating a solid state image sensor according to claim 2;
    wherein said step of comparing is executed by comparing at least one of the following factors:
    a maximum frequency;
    a mean output value;
    a standard deviation of said frequency distribution;
    a minimum value of said unit cell output values;
    a maximum value of said unit cell output values;
    a difference between a mean output value and said minimum value of said unit cell output values, and
    a difference between said mean output value and said maximum value of said unit cell output values.

5. A method of evaluating a solid state image sensor according to claim 2;
    wherein said step of comparing is executed by comparing the measured frequency distribution in the state of not emitting light to said solid state image sensor to be evaluated under a high temperature condition, with the standard frequency distribution in the state of not emitting light to said standard solid state image sensor under a high temperature in order to judge the classification of the picture quality of said solid stae image sensor to be evaluated.

6. A method of evaluating a solid state image sensor according to claim 2;
    wherein said step of comparing is executed by comparing said measured frequency distribution with said standard frequency distribution, and thereby extracting abnormal distributions appeared at the upper or lower side of a mean value of said standard frequency distribution in order to judge the state of black or white flaws on the screen of said solid state image sensor to be evaluated.

* * * * *